United States Patent [19]

Palmer

[11] 4,267,598

[45] May 12, 1981

[54] NOISE-MEMORY REGULATED SQUELCH COMPENSATOR

[76] Inventor: Arthur J. Palmer, 2036 Coronet Dr., Largo, Fla. 33540

[21] Appl. No.: 14,125

[22] Filed: Feb. 22, 1979

[51] Int. Cl.³ .......................... H04B 1/44; H04B 1/10
[52] U.S. Cl. ...................................... 455/78; 455/219
[58] Field of Search .................... 455/78, 79, 84, 219, 455/220, 222

[56] References Cited

U.S. PATENT DOCUMENTS

| | | | |
|---|---|---|---|
| 3,719,892 | 3/1973 | Yamazaki et al. | 455/219 |
| 4,060,764 | 11/1977 | Bethards et al. | 455/219 |
| 4,158,814 | 6/1979 | Imazeki et al. | 455/78 |

Primary Examiner—Jin F. Ng

[57] ABSTRACT

A noise-memory regulated squelch compensating circuit for receivers using AGC voltage dependent squelch is disclosed. This compensating circuit cancels the gradual change in AGC voltage component at the squelch control that is due to the gradual rise and decay of diurnal noise at the receiver input. This is accomplished by summing this change in AGC voltage component with an equal but opposite voltage change determined by the charge on a memory capacitor updated by a noise level detector diode. Thus the relatively constant level at the squelch control during no signal conditions makes readjustment of the control unnecessary regardless of diurnal noise level change.

1 Claim, 1 Drawing Figure

NOISE-MEMORY REGULATED SQUELCH COMPENSATOR

This invention relates to an improvement in automatic gain control voltage dependent squelch circuits used in citizens band and other two way radio transceivers and receivers. These squelch circuits require frequent resetting of squelch controls throughout the daily rise and fall of receiver input noise levels. When atmospheric conditions are favorable, it is not uncommon for a gradual rise in input noise from a level of about a microvolt to a peak of several hundred microvolts between dawn and mid-day followed by a gradual subsiding of the noise to a low level sometime after dark. In present receiver sections using AGC voltage dependent squelch circuits, when the operator adjusts his squelch control to silence the receiver audio on noise, there are three possible ensuing results:

1. The noise level will continue t rise causing AGC voltage to soon terminate the squelch condition which in turn requires operator readjustment, or
2. The noise level will gradually fall and the receiver will remain silent even during low level signals that would be clearly readable due to the decreased noise, or
3. The noise level will remain constant, the squelch circuit blocking noise and allowing only the readable detected audio to pass through the audio amplifier to the speaker.

Unfortunately, due to the diurnal variation in noise level mentioned, result number three is seldom prevalent.

In view of the above effects, CB operators often disable the squelch and endure constant speaker noise to avoid missing readable transmissions, while some take the opposite tack and set their squelch controls to respond to only exceptionally strong signals, squelching many readable signals.

The present invention provides a noise memory controlled compensating voltage to the existing receiver squelch control potentiometer which cancels the gradual rise and fall of squelch control voltage caused by diurnal noise level change. The squelch control, once satisfactorily set, will remain so indefinitely with the addition of the present invention circuit. The end result is greatly enhanced enjoyment and usefulness of CB and other receivers.

SUMMARY OF THE INVENTION

The object of the present invention is to eliminate the need for repeated squelch control adjustment in receivers using AGC voltage dependent squelch circuits. The need for these adjustments become obvious to the operator when diurnally rising noise levels cause a gradual change in the no-signal AGC voltage level which places the squelch amplifier in the cutoff condition in turn causing a completed path for detected noise through the audio amplifier to the speaker. The need for adjustment is less obvious to the operator when gradually descending noise levels cause an AGC voltage excursion to further reinforce the conductive state of the squelch amplifier effectively blocking many readable intelligence signals from passage through the audio amplifier.

The basic principle of the present invention is to provide a constant squelch threshold level throughout the daily range of background noise rise and decay by offsetting the AGC voltage component change due to noise level with an equal but opposite compensating voltage change at the squelch amplifier input. This compensating voltage varies in proportion to the average noise level and is essentially independent on the AGC levels relating to useable signals.

In the embodiment to be later described in detail, the foregoing principle is realized by connecting a noise level detector diode through an isolating resistor to the receiver AGC voltage line, and a capacitor to the diode output in such a way as to form a peak detector circuit for the average minimum signal or peak positive excursions of the AGC voltage. Having a relatively long discharge time constant, the capacitor becomes a memory for storage of the voltage level of these minimum signal excursions which are representative of noise level. This memory capacitor's discharge time is greatly increased, by circuits of the present invention when the audio is unsquelched or when the transmitter is keyed. At these times a discharge inhibit circuit blocks the capacitors primary discharge path and the charge is retained. This is desireable because at these times the AGC voltage is totally non-representative of noise level, in one case because the receiver section is disabled during transmission, and in the other instance when the audio is unsquelched, AGC voltage is representative of received signal strength. In either event, there are no minimum signal excursions available representative of noise with which the diode could update the memory capacitor charge.

The memory capacitor charge, thus closely representative of most recent average noise level, is applied to, and reverse biases the gate of a junction field effect transistor (JFET) which amplifies and inverts any change in gate voltage at its drain. The drain voltage change, an amplified inverted replica of the change of voltage level in storage, is applied through a series resistor to a "compensation gain" potentiometer, one end of which is connected to circuit common, and the wiper of which is connected via an isolating resistor to the high side of the receiver's squelch control in the input circuit of the squelch amplifier transistor, completing the path for compensating voltage in the present invention.

The lead connecting the receivers AGC voltage component to the squelch control potentiometer is broken at the high side of the pot and a series resistor added. The high side of the squelch control potentiometer thus becomes a summing junction for the varying AGC voltage applied to it through one resistor and the noise level compensation voltage applied through the resistor tied to the wiper of the compensation gain potentiometer. The result is a constant voltage applied to the squelch control potentiometer during no-signal intervals (regardless of noise level) throughout the day, eliminating the need for squelch control adjustment once set.

A normally open, momentary contact type "noise reset" switch and series resistor is connected between the high side of the memory capacitor and the high side of the resistor which connects AGC voltage component to the squelch control. Depressing the "noise reset" switch for two or three seconds during noise input corrects the voltage level in storage by resetting the charge on the memory capacitor to a level approximating the point to which it would eventually charge or discharge through normal circuit action. This feature is especially useful when switching from a channel to one which is noisier. The need for reset when changing to a noisier channel will become immediately obvious to the operator with the occurrence of speaker noise, at which point, the "noise reset" switch may be used to quickly discharge the capacitor to the approximate level required simultaneously squelching the audio. When the "reset switch" is opened, the charge or discharge action of the memory capacitor in conjunction with the noise detector diode provides fine adjustment to the precise level of compensation required for optimum squelch threshold. When switching from a relatively noisy channel to one which is quieter, the need for reset is not apparent to the operator, but the memory capacitor's quick charging action through the then forward biased detector diode provides an automatic exponential reset which is approximately 90% complete in 30 seconds. The reset feature, together with the "squelch disable" switch to be next briefly discussed, reduce the need for operator readjustment of the squelch control to an extreme rarity.

A "squelch disable" switch is connected between the wiper of the "compensation gain" control and the resistor which feeds compensating voltage from that control to the summing junction or high side of the squelch control. When this switch is opened, the path for compensating voltage is broken and the squelch amplifier input swings much less positive, causing the amplifier to cutoff, in turn unsquelching the audio. This switch would find usefulness when there is a need for monitoring weak signals at the noise level, and provides a rapid means to this end without disturbing the squelch control setting.

The "compensation gain" control is an internal factory or servicer adjustment. The squelch control and switches described briefly in this summary are front panel available for operator use.

The discharge inhibit circuit mentioned earlier in this summary is a highly desireable though not essential adjunct to the operation of the present invention. An early prototype performed satisfactorily with a smaller value memory capacitor which discharged slowly through its own leakage resistance. A minor drawback, however, existed in that the time constant chosen became more critical, e.g.: A longer discharge choice was more immune to voltage change during the reception of prolonged "monologue" transmissions but occasionally needed reset when daily noise levels were rising rapidly. Conversely, a capacitor chosen for a shorter discharge time tracked the fast rising noise levels well but was subject to an unwanted discharge during received r.f. signals proportional to their duration. The inhibit circuit eliminates this problem by providing a dual time constant discharge capability. At times when the receiver audio is squelched, the memory capacitor's discharge rate is enhanced by a path from the capacitor high side through a resistor and conducting inhibit diode to the junction of a resistive divider connected between the collector of the squelch amplifier transistor and circuit common. The time constant thus afforded is not too high to follow the faster changing AGC voltage variation representative of noise coincident with more rapidly rising diurnal noise levels. During signal reception, when the audio is not squelched, the voltage divider in the squelch amp collector circuit provides a means to reverse bias the inhibit diode, blocking the primary path for memory capacitor discharge and effectively preventing an erroneous level shift at that capacitor during extended periods of signal reception.

The inhibit circuit voltage divider junction is also connected to a detector diode and capacitor combination connected to a point in the transmitter r.f. output circuit. When the transmitter is keyed, the diode detected r.f. energy produces a small voltage across this capacitor which is connected to the inhibit divider to reverse bias the inhibit diode, in turn preventing unwanted memory capacitor discharge during transmit time.

In concluding this summary it is worth noting that the JFET drain in this embodiment is connected through a resistor to the transceiver's 13.8 volt source, while receiver r.f. circuits are fed from a 9 volt line that is reduced to zero volts when the microphone is keyed at transmit time. If the JFET were fed from the interrupted 9 volt line, the JFET source would drop to zero on transmit. The memory capacitor charge would then be "dumped" into the gate junction of the JFET which would then be forward biased.

BRIEF DESCRIPTION OF THE DRAWING

The sole drawing, FIG. 1, of this application, is divided into an upper dashed-line enclosed area representing a partial schematic of a commercially available citizens band transceiver, and a lower dashed-line enclosed area representing an embodiment realizing the principles of the present invention for this particular receiver. The detailed description which follows will refer to the drawing by number.

DETAILED DESCRIPTION

Figure 1:
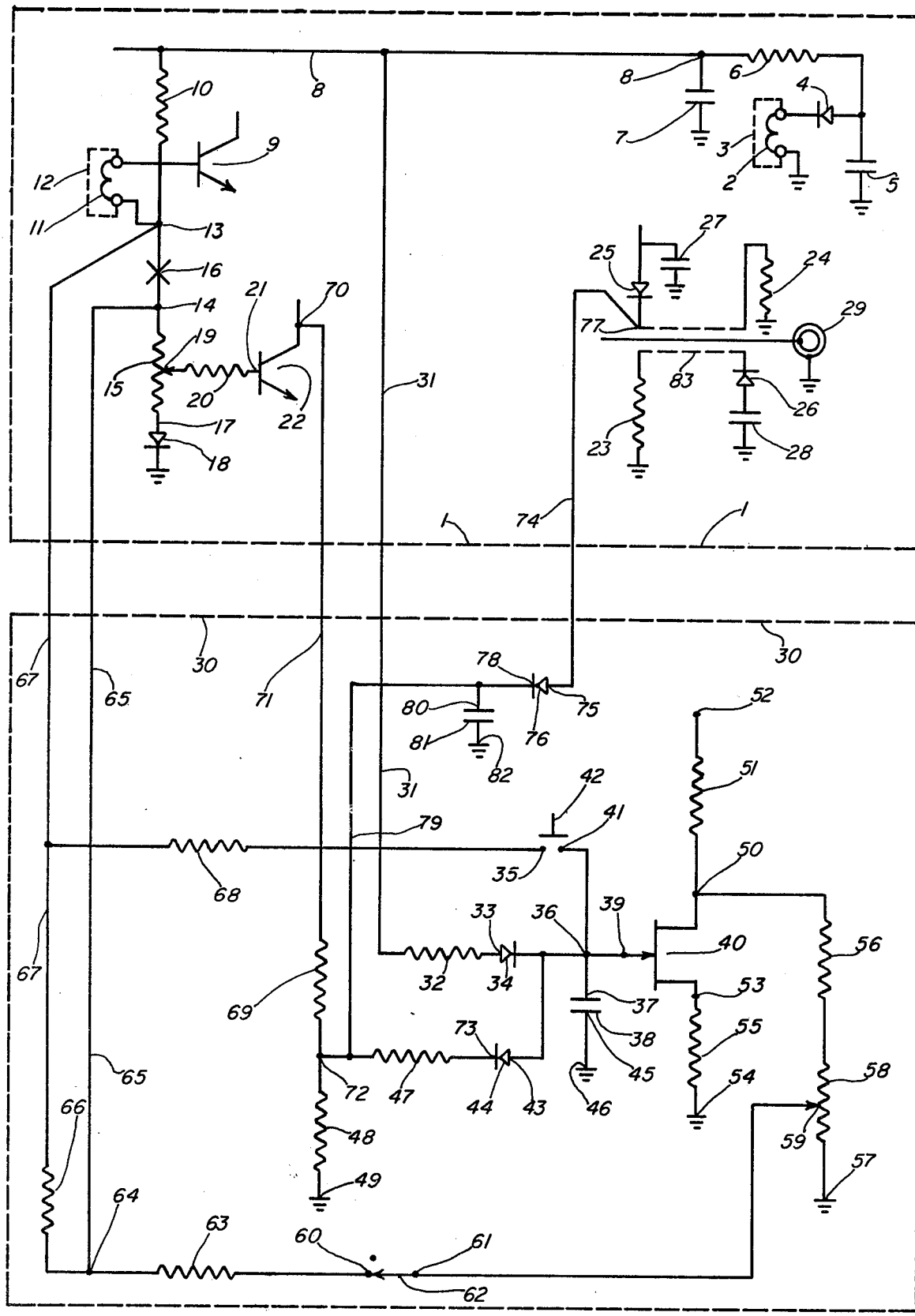

In the upper section of FIG. 1 bounded by dashed-line 1 existing transceiver circuits include the secondary winding 2 of final i.f. transformer 3 which drives audio and AGC detector diode 4 which in turn connects to the junction of resistor 6 and r.f. bypass capacitor 5 which is returned to common. From the other end of resistor 6 a capacitor 7 is connected with its opposite end tied to circuit common. The high side 8 of this capacitor 7 is the receiver AGC voltage line for all the AGC controlled stages of the receiver section including second converter transistor 9 by way of resistor 10 and secondary winding 11 of transformer 12. Prior to modification for the present invention there is a direct path from the low side 13 of this secondary winding 11 and its junction with resistor 10 to the high side 14 of squelch control potentiometer 15. Since the figure upper dashed-line area also shows interconnections necessary for the inclusion of the present invention embodiment, the original connection at high side 14 of potentiometer 15 is shown broken at 16. The low side 17 of potentiometer 15 is returned to common through diode 18. The wiper 19 of potentiometer 15 is connected through resistor 20 to the base 21 of squelch amplifier transistor 22. The conducting or nonconducting state of transistor 22 determines respectively blocking or completing of the path for detected audio through the audio amp and speaker circuits (not shown). A portion of the transmitter's r.f. output section is shown including directional coupler 83 and associated components consisting of resistors 23 and 24, diodes 25 and 26, capacitors 27 and 28, and r.f. output connector 29.

The lower section of FIG. 1 bounded by dashed line 30 contains the added components necessary to realize the principles of the present invention for this preferred embodiment. Lead 31 from AGC line 8 connects the positive polarity AGC voltage, which goes less positive with increasing noise or signal, through isolating resistor 32 to the anode 33 of noise level detector diode 34. Junction 36 becomes a tie point for the cathode of diode 34, the high or positive terminal 37 of noise memory capacitor 38, the gate 39 of junction field effect transistor 40, one terminal 41 of normally open "noise reset" switch 42 and the anode 43 of diode 44. The low side 45 of memory capacitor 38 returns to common at 46. The major discharge path for memory capacitor 38 is through inhibit diode 44, resistor 47 and resistor 48 to common at 49. When power is applied to the receiver, capacitor 38 charges within 30 seconds to about 90% of a final voltage representative of background noise level assuming there are no r.f. transmissions in progress on the channel. The charge route is via noise level detector diode 34, resistor 32 through lead 31 to AGC line 8. For all practical purposes, this charge can be considered complete in a total of 60 seconds. As the no-signal noise level gradually increases, the peak positive voltage excursions on lead 31 are reduced proportionately, through normal AGC action, allowing capacitor 38 to discharge to a new, less positive level, the discharge path being primarily through diode 44, resistor 47 and resistor 48. When this level is reached, the peak positive excursions of the AGC voltage on line 31 provide charge currents to the memory capacitor sufficient to offset the effect of the slow discharge rate and the capacitor voltage remains essentially constant. Should the noise level later decrease, the peak positive voltage excursions on line 31 rise again, recharging capacitor 38 via diode 34 and resistor 32 to a new level representative of noise at that time. Thus, the voltage level in storage at memory capacitor 38 is periodically updated and represents a close inverse approximation of receiver noise level at any time. Factors which could adversely affect this desired condition are corrected by the discharge inhibit circuit to be explained later in this detailed description.

The voltage change at junction 36 from the high side 37 of capacitor 38 is applied to the gate 39 input of junction field effect transistor 40, varying the JFET 40 conductance and producing an amplified and inverted replica of the voltage change, at the drain 50 of JFET 40. The drain 50 is connected to the receiver 13.8 volt positive supply point 52 through drain resistor 51, while the source 53 returns to common point 54 through source resistor 55.

As the input noise level to the receiver of this embodiment increases on a particularly noisy day from near zero to about a thousand microvolts, the memory capacitor 38 voltage, and hence the gate 39 voltage of JFET 40 decreases from about 1.6 volts to about 0.7 volt (in accord with the decreasingly positive no-signal excursions of receiver AGC.) The JFET 40 linearly amplifies by approximately four times and inverts this voltage change at its drain 50 where the voltage changes from 3.2 to 7.25 volts. A series divider consisting respectively of resistor 56 and "compensation gain" potentiometer 58 is connected from drain 50 to common at 57. Potentiometer 58 is factory or servicer adjusted for a wiper 59 voltage swing of about 25% of the drain 50 voltage change in a manner to be later covered in this detailed description.

The wiper 59 voltage, which, after adjustment varies equally with but opposite to the receiver section noise level AGC voltage component at junction 13, is applied through closed contacts 61 and 60 of "squelch disable" switch 62 and then through resistor 63 to junction point 64 which connects via lead 65 to the high side 14 of receiver squelch control potentiometer 15. Junction point 64 is also connected back to the receiver AGC line via resistor 66 and lead 67 to junction 13 and resistor 10.

Junction point 64 is thus fed AGC voltage component through resistor 66 and compensation voltage through resistor 63. Now, when the positive no-signal AGC voltage component arriving at junction 64 through resistor 66 would decrease due to a gradual noise level increase, the effect is cancelled by an equivalent increase in the compensation voltage fed junction 64 through resistor 63. The wide range of gradual change in the no-signal AGC voltage that occurs daily due to noise level change is now offset by an equal but opposite compensating voltage at a summing junction 64 to which the squelch control 15 is connected. Thus the need for resetting of the control 15 is eliminated.

Normally open "noise reset" switch 42, through its contacts 41 and 35, can be closed to complete a path for the AGC voltage component from lead 67 through resistor 68 to junction 36 to quickly discharge memory capacitor 38 to the correct level when changing from a channel to a noisier one. This action is optional when switching to a quieter channel since the charge rate of the capacitor is fast enough to provide a 90% correction in about 30 seconds. The "noise reset" switch 42 as the name implies must be depressed on noise reception to be effective in normal operation. This switch is also useful when the factory or servicer checks or adjusts the "compensation gain" pot 58. Switch 42 is held depressed feeding the AGC voltage component on line 67 via resistor 68 to memory capacitor 38, and while monitoring the d.c. voltage at junction 64, the "compensation gain" control 58 is adjusted for a plus or minus zero volt change in level from minimum to maximum signal or noise input. In casual consideration of the effect of this adjustment, it may seem at first that we have cancelled the effect of AGC changes at the squelch amplifier input defeating the squelch action. It must be considered, however, that when the reset switch is released, the compensation voltage follows only noise level allowing the AGC voltage component at junction 64 to swing in response to signal component AGC.

Two factors, not heretofore discussed in detail, could cause a nonrepresentative charge to develop across the memory capacitor 38 if not corrected by discharge inhibit circuitry. Received signals of long duration would allow memory capacitor 38 to discharge sufficiently to cause a high and incorrect compensating voltage to build at the summing junction 64. This would have the effect of squelching signals that are well above the noise level after the received signal ends and for the length of time necessary to recharge memory capacitor 38.

Using an especially long discharge time constant would minimize this problem but simultaneously place a restriction on the circuits ability to follow fast rising diurnal noise levels. Under these conditions, the audio would be "un-squelched" and manual reset would then be required to make up for the discharge lag. For this reason, in the preferred embodiment shown in FIG. 1, the discharge rate is made sufficiently short to follow rapid diurnal rise of input noise, and a discharge inhibit circuit is added consisting of inhibit diode 44, and resistors 47, 48 and 69. From the collector 70 of squelch amp transistor 22 a lead 71 connects to one end of resistor 69 the other end of which ties to resistor 48 which is returned to common at 49. These resistors 69 and 48 form a voltage divider for the collector 70 voltage of squelch amp transistor 22. When a received signal causes transistor 22 to cut off taking the receiver out of squelch mode, the collector 70 voltage rises from close to zero to approximately 6 volts. The voltage at 72 simultaneously rises to about 1.5 volts. Junction 72 also connects to discharge time constant determining resistor 47 which ties to the cathode 73 of inhibit diode 44. The anode 43 of diode 44 then connects to junction 36 and the high side 37 of memory capacitor 38. In squelched mode, diode 44 is forward biased and a primary discharge path exists for capacitor 38 via diode 44, resistor 47 and resistor 48. When AGC voltage associated with a received signal cuts off the squelch amplifier transistor 22, the resultant 1.5 volts at junction 72 applied through resistor 47 to the cathode 73 of inhibit diode 44, removes the forward bias or reverse biases diode 44. This blocks the primary discharge path and capacitor 38 retains its charge eliminating the unwanted discharge that would otherwise occur during lengthy received signals.

A second factor that could cause a non-representative charge to develop across memory capacitor 38 is the receiver shutdown that occurs during transmit time. With no positive going AGC voltage excursions to update the charge on capacitor 38, an unwanted discharge would occur in proportion to the duration of the transmit time, and a high incorrect compensating voltage would build at summing junction 64. After the transmitter is unkeyed, some received signals well above the noise level would be squelched until the memory capacitor had the time and opportunity to recharge. To eliminate this problem, the anode 75 of a diode 76 is connected via lead 74 to the cathode 77 tiepoint of diode 25 located at the directional coupler input of the transmitter r.f. output section. Cathode 78 of diode 76 is connected via lead 79 to junction 72 of resistors 47, 48 and 69. The high side 80 of a capacitor 81 is connected to cathode 78 of diode 76. The low side of this capacitor 81 returns to common at 82. Diode 76 and capacitor 81 form a detector for r.f. energy at transmit time with about 2 volts appearing at the cathode 78 of diode 76. This voltage is transferred via lead 79 to junction 72 and through resistor 47 to the cathode 73 of inhibit diode 44. This action reverse biases diode 44 blocking the memory capcitor 38 primary discharge path for the duration of the transmission. "Squelch disable" switch 62, which normally connects the wiper 59 of "compensation gain" pot 58 to the summing junction 64 via resistor 63, provides a means for disabling squelch when desired without disturbing the setting of squelch control 15. Opening switch 62 removes positive voltage contributed to the summing junction 64 by the "compensation gain" control. This results in a voltage shift of negative direction at summing junction 64 which keeps the squelch amp transistor 22 out of squelched mode.

Typical values of the invention embodiment components of the FIG. 1 circuit may be:

| Component | Value |
| --- | --- |
| 32 | 22k ohm ¼ watt |
| 51 | 6800 ohm ¼ watt |
| 55 | 1000 ohm ¼ watt |
| 56 | 100k ohm ¼ watt |
| 58 | 100k ohm control |
| 63,66 | 68k ohm ¼ watt |
| 69 | 8.2 megohm ¼ watt |
| 48 | 3.3 megohm ¼ watt |
| 47 | 10 megohm ¼ watt |

-continued

| Component | Value |
| --- | --- |
| 68 | 4700 ohm ¼ watt |
| 38 | discmicrofarad 25vdc |
| 81 | .018 microfarad dic |

The junction field effect transistor 40 in FIG. 1 is a Sylvania type ECG 133 while diodes 34, 44 and 76 are Sylvania type ECG 177.

In applying the principles of this invention to other receiver circuits, various changes may occur to one skilled in the art which do not depart from the spirit or scope of the invention as claimed.

What is claimed is:

1. In a transceiver having
a 13.8 volt positive supply point,
a capability of being switched from one channel to any of a multiplicity of channels,
a source of transmitter r.f. output energy at a directional coupler,
a receiver section which includes an audio detector diode to supply audio signal to the audio amplifier stages of said transceiver, said audio detector diode also providing a signal-proportional negative voltage contribution through a resistor to a positive voltage line which is the AGC voltage line of said transceiver, and thence through a second resistor to an AGC voltage component source, said AGC voltage component source providing AGC voltage component and AGC voltage component change through a connection to the high side of a squelch control, the low side of said squelch control being returned through a diode to circuit common, and the wiper of said squelch control being connected through a resistor to the input of a squelch amplifier transistor arrangement allowing the conduction point of said squelch amplifier transistor and the squelching of said audio signal to be determined by the level of said AGC voltage component and by the setting of said squelch control of said receiver section of said transceiver, the improvement thereof being: a noise-memory regulated squelch compensating circuit for squelch circuits controlled by AGC voltage, said compensating circuit utilizing the introduction of an approximately equal and opposite offset voltage change, determined by a periodically updated noise memory circuit, to cancel said AGC voltage component change at said squelch control that is due to the gradual, diurnal rise and decay of noise level at the input of said receiver section of said transceiver, thereby eliminating the need for readjustment of said squelch control, once said control is satisfactorily set, said compensating circuit comprising:

a. means for detecting and storage of the peak values of AGC voltage excursions representative of said noise level, which includes a noise level detector diode, the anode of said detector diode being connected through an isolating resistor to said positive voltage line which is the AGC voltage line of said transceiver; and which means also include a memory capacitor being connected between the cathode of said detector diode and circuit common, this arrangement resulting in the charging of said memory capacitor to a voltage level representative of the average peak level of said excursions through said noise level detector diode and said isolating resistor, said voltage level being updated by recharge when necessary or being retained for a time in storage by said memory capacitor due to its relatively long time constant discharge rates;

b. means for quick correction of the voltage level in storage when switching from said one channel to any of a higher or lower noise level, which includes a normally open "noise reset" switch which can series connect the high side of said memory capacitor through a resistor to a reset voltage source, which in said transceiver is said AGC voltage component source for said squelch control of said receiver section, thereby providing a relatively short time constant charge or discharge path for said quick correction of said voltage level in storage;

c. means for producing an amplified and inverted replica of the gradual changes of said voltage level in storage, which includes a junction field effect transistor with its gate connected to said high side of said memory capacitor and its drain being connected through a resistor to said 13.8 volt positive supply point of said transceiver, and the source of said field effect transistor being returned through a resistor to circuit common, these connections resulting in a linearly amplified and inverted change in voltage at said drain as said voltage level in storage across said memory capacitor is altered;

d. means for attenuating said amplified and inverted replica of said gradual changes of said voltage level in storage to the compensation level required to offset or cancel the noise level produced AGC voltage component change at said squelch control, which includes a series connected resistor and "compensation gain" potentiometer respectively connected between said drain of said junction field effect transistor and circuit common, said potentiometer being factory or servicer adjustable for said compensation level required at the wiper of said potentiometer;

e. means for coupling the voltage of said compensation level required to offset or cancel said noise level produced AGC voltage component change at said squelch control, which includes a connection from said wiper of said "compensation gain" potentiometer through the normally closed contacts of a "squelch disable" switch and first series resistor to a junction point connected to said high side of said squelch control, with a second series resistor being connected between said junction point and said AGC voltage component source for said squelch control, this arrangement producing a summing junction at said junction point where the voltage is held essentially constant by said voltage of said compensation level during no-signal intervals throughout the diurnal range of rise and decay of said noise level at said input of said receiver section of said transceiver;

f. means to inhibit the gradual loss of said voltage in storage when said audio signal of said receiver section of said transceiver is not squelched, which includes a divider formed by two series connected resistors added between the collector of said squelch amplified transistor of said receiver section and circuit common, the junction of said resistors being then connected through a third resistor to the cathode of an inhibit diode, the anode of which connects to said high side of said memory capacitor, the primary discharge path of said memory capacitor being through said inhibit diode and said third resistor to said junction of said series connected resistors, and through the lower of said series connected resistors to circuit common, this arrangement resulting in a positive voltage at said junction when said squelch amplifier transistor is in its cutoff state, said positive voltage being applied through said third resistor to said cathode of said inhibit diode, removing forward bias or applying reverse bias to said inhibit diode, blocking said primary discharge path for said memory capacitor and preventing said loss of said voltage in storage whenever said squelch amplifier transistor is cut off and said audio signal of said receiver section is not squelched;

g. means to inhibit the gradual loss of said voltage in storage when said transceiver is in "transmit" mode, which includes a diode detector, the anode of which connects to said source of transmitter r.f. output energy at said directional coupler of said transceiver, the cathode of said diode detector being connected to said junction of said series connected resistors of said divider added between said collector of said squelch amplifier transistor and circuit common, and said cathode of said diode detector also being connected through a capacitor to said circuit common, the positive voltage appearing across said capacitor at transmit time due to the detection of said transmitter r.f. output energy by said diode detector being applied through said junction of said series connected resistors and said third resistor to said cathode of said inhibit diode, reverse biasing said inhibit diode, thereby blocking said primary discharge path for said memory capacitor for the duration of said "transmit" mode preventing said gradual loss of said voltage in storage;

h. means to produce an unsquelched condition without disturbing said setting of said squelch control of said transceiver, which includes a normally closed "squelch disable" switch connected between said wiper of said "compensation gain" potentiometer and said resistor connecting said compensation voltage to said summing junction and said high side of said squelch control, said "squelch disable" switch making possible the interruption of said compensation voltage to said summing junction, causing the voltage at said junction to swing less positive, in turn causing the cutoff of said squelch amplifier transistor and the production of an unsquelched condition without disturbing said setting of said squelch control of said receiver section of said transceiver.

* * * * *